(12) United States Patent
Kaneko et al.

(10) Patent No.: US 8,014,223 B2
(45) Date of Patent: Sep. 6, 2011

(54) SEMICONDUCTOR DEVICE

(75) Inventors: Atsushi Kaneko, Yokohama (JP); Yasuo Okada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 392 days.

(21) Appl. No.: 12/199,913

(22) Filed: Aug. 28, 2008

(65) Prior Publication Data

US 2009/0057723 A1 Mar. 5, 2009

(30) Foreign Application Priority Data

Aug. 28, 2007 (JP) ................................. 2007-220507

(51) Int. Cl.
*G11C 17/18* (2006.01)

(52) U.S. Cl. ..................... 365/225.7; 365/226; 365/228; 365/229

(58) Field of Classification Search ............... 365/225.7, 365/226, 228, 229
See application file for complete search history.

(56) References Cited

U.S. PATENT DOCUMENTS

| | | | |
|---|---|---|---|
| 6,707,746 B2 * | 3/2004 | Frankowsky et al. ...... | 365/225.7 |
| 7,161,834 B2 | 1/2007 | Kumahara et al. | |
| 7,185,145 B2 * | 2/2007 | Mizushima et al. ......... | 711/115 |
| 7,281,101 B2 * | 10/2007 | Mizushima et al. ......... | 711/163 |
| 7,292,493 B1 * | 11/2007 | Ashizawa et al. .......... | 365/225.7 |
| 7,495,329 B2 * | 2/2009 | Ohta et al. .................... | 257/692 |
| 2005/0052924 A1 | 3/2005 | Nishizawa et al. | |

FOREIGN PATENT DOCUMENTS

| | | |
|---|---|---|
| JP | 63-40982 | 2/1988 |
| JP | 2-217296 | 8/1990 |
| JP | 2-283051 | 11/1990 |
| JP | 3-224024 | 10/1991 |
| JP | 5-8947 | 2/1993 |
| JP | 7-93494 | 4/1995 |
| JP | 10-250642 | 9/1998 |
| JP | 2001-29553 | 2/2001 |
| JP | 2002-49441 | 2/2002 |
| JP | 2003-257197 | 9/2003 |
| JP | 2005-84935 | 3/2005 |
| JP | 2005-128991 | 5/2005 |
| JP | 2007-133630 | 5/2007 |
| JP | 2007-164822 | 6/2007 |

* cited by examiner

*Primary Examiner* — Pho M Luu

(74) *Attorney, Agent, or Firm* — Oblon, Spivak, McClelland, Maier & Neustadt, L.L.P.

(57) ABSTRACT

A semiconductor device including a plurality of semiconductor elements, a substrate on which the plurality of semiconductor elements are mounted, the substrate also having a plurality of terminals for connecting to external equipment, a fuse mounted on the outside of a mounting area of the plurality of semiconductor elements and mounted on a surface of the substrate near a power supply terminal among the plurality of terminals, and the power supply terminal and the plurality of semiconductor elements are connected via the fuse.

23 Claims, 13 Drawing Sheets

SEMICONDUCTOR DEVICE

CROSS REFERENCE TO RELATED APPLICATION

This application is based upon and claims the benefit of priority from the prior Japanese Patent Application No. 2007-220507, filed on Aug. 28, 2007, the entire contents of which are incorporated herein by reference.

BACKGROUND OF THE INVENTION

Field of the Invention

This invention is related to a semiconductor device and in particular a semiconductor device mounted with a plurality of semiconductor elements.

In Laid Open Patent 2003-257197, a semiconductor device which includes two memory chips which have the same usage, an internally mounted fuse which can be broken or unbroken via an external signal and in which one or both of the memory chips can be operated in a state in which the fuse is broken or unbroken according to the generation conditions of the external signal, is disclosed.

In Japanese Laid Open Patent 1998-250642, a vehicle accident situation record device is disclosed which includes a memory card internally mounted with a fuse and in which programming to and erasing of a flash memory within the memory card is forbidden by breaking the fuse in the case where it is judged via an acceleration detection result that an accident has occurred.

In Laid Open Patent 2002-49441, a PC card is disclosed which is internally mounted with a fuse which melts and breaks via an external current and which can switch an internal operation current depending on whether this fuse is broken or not.

BRIEF SUMMARY OF THE INVENTION

The semiconductor device related to an embodiment of the present invention is arranged with a plurality of semiconductor elements; a substrate on which said plurality of semiconductor elements are mounted, said substrate also having a plurality of terminals for connecting to external equipment; a fuse mounted on the outside of a mounting area of said plurality of semiconductor elements and mounted on a surface of said substrate near a power supply terminal among said plurality of terminals; and said power supply terminal and said plurality of semiconductor elements are connected via said fuse.

The semiconductor device related to an embodiment of the present invention is arranged with a plurality of semiconductor elements; a substrate on which said plurality of semiconductor elements are mounted, said substrate also having a plurality of terminals for connecting to external equipment and a protrusion formed on a part of the periphery of said substrate on which other elements are mounted; a fuse mounted on said protrusion; and a power supply terminal among said plurality of terminals and said plurality of semiconductor elements are connected via said fuse.

The semiconductor device related to an embodiment of the present invention is arranged with a plurality of semiconductor elements; a substrate on which said plurality of semiconductor elements are stacked in a mounting area, said substrate also having a plurality of terminals for connecting to external equipment; a fuse mounted on the outside of said mounting area of said plurality of semiconductor elements and mounted on a surface of said substrate near a power supply terminal among said plurality of terminals; and said power supply terminal and said plurality of semiconductor elements are connected via said fuse.

DETAILED DESCRIPTION OF THE INVENTION

Figure 1:
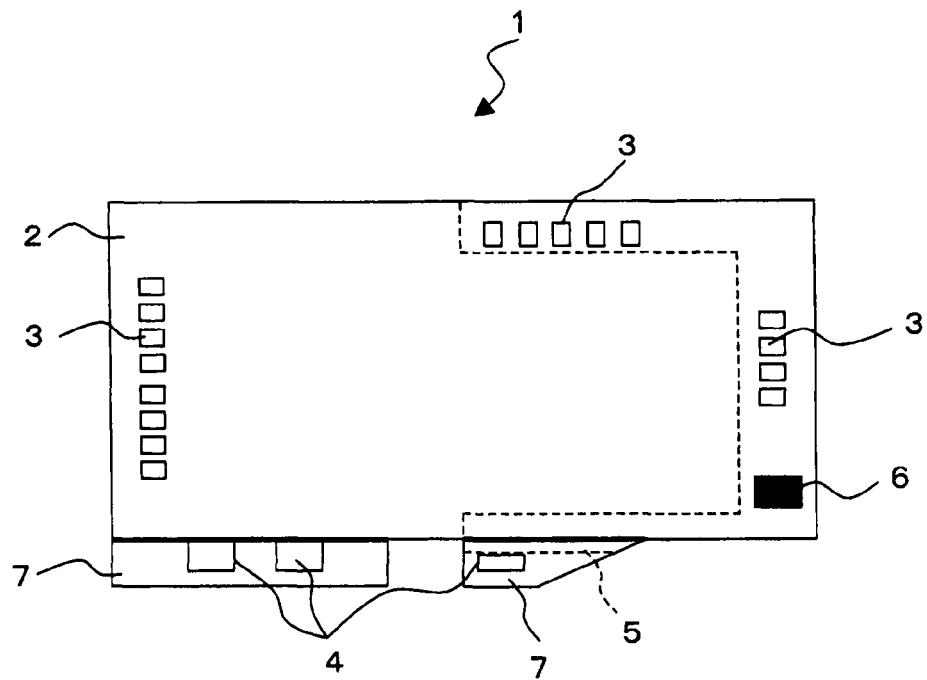
FIG. 1 is top view diagram which shows a memory card before a memory chip and a controller chip are mounted related to a first embodiment.

The embodiments of the present invention will be explained below while referring to the drawings. In the semiconductor device related to the embodiments, the memory card will be explained as an example. Furthermore, the same structural elements have the same symbols and therefore explanations will be omitted in some embodiments to avoid repetition.

First Embodiment

Figure 2:
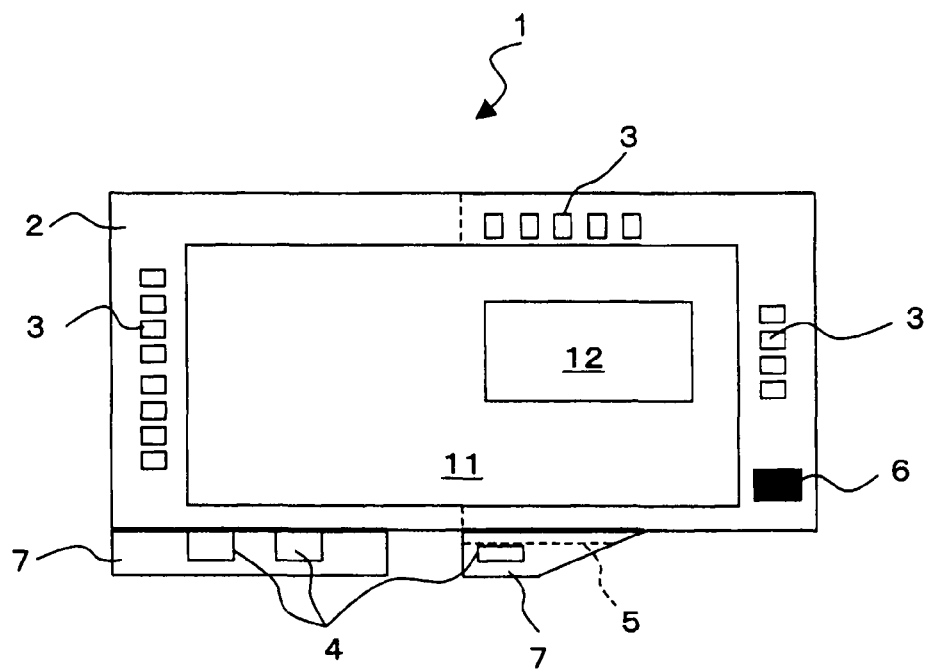
FIG. 2 is top view diagram which shows a memory card after a memory chip and a controller chip are mounted related to a first embodiment.

As is shown in FIG. 1 and FIG. 2, the memory card 1 related to the first embodiment includes a substrate 2, a plurality of substrate pads 3 which are formed on an outside element mounting area 5, a plurality of electrical parts 4 (for example, a condenser) mounted on a protrusion 7 of the substrate 2, a fuse 6 which is mounted near a power supply connector 3A (see FIG. 6) of the outside element mounting area 5, a memory chip 11 which is mounted within an element mounting area and a controller chip 12 which is stacked on a layer (the layer in the forefront in the diagram) above the memory chip 11.

Figure 3:
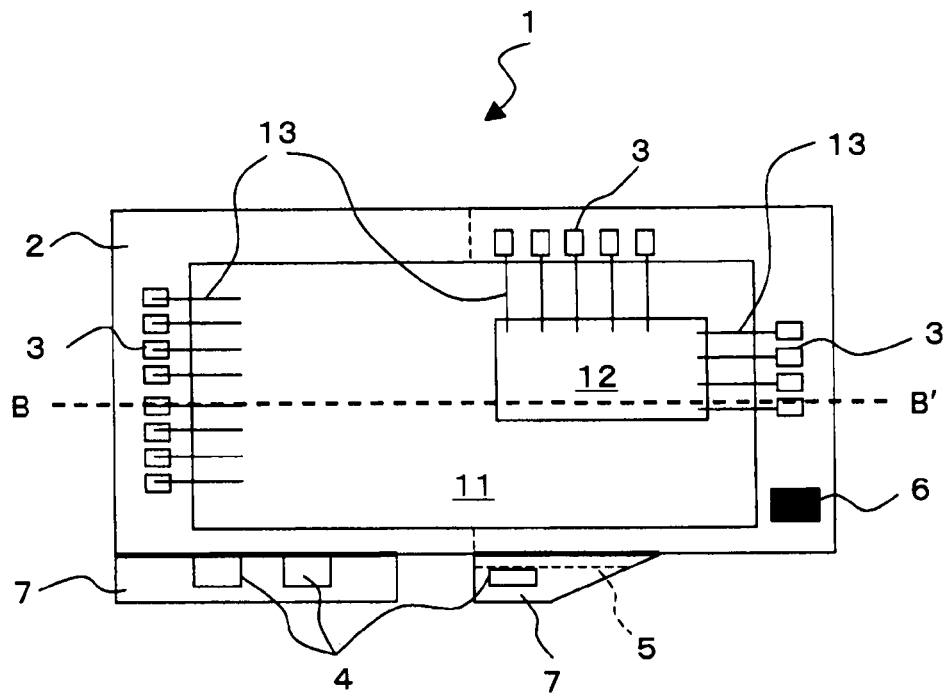
FIG. 3 is a top view diagram which shows a memory card after a bonding wire is connected related to a first embodiment.
Figure 4:
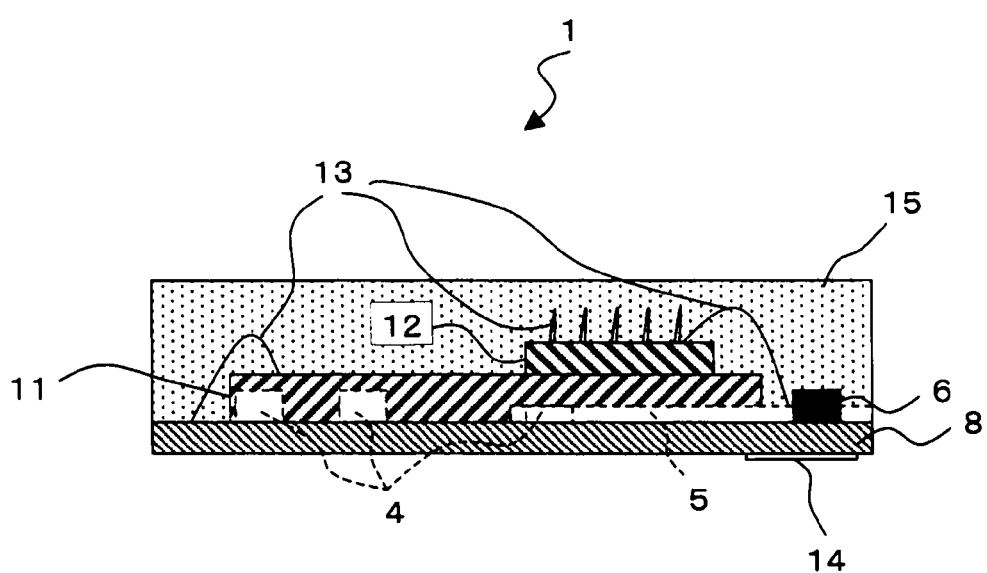
FIG. 4 is a cross sectional diagram which shows a memory card which is sealed by a resin mold related to a first embodiment.

FIG. 1 is a top view diagram of the memory card 1 before the memory chip 11 and controller chip 12 are mounted. FIG. 2 is a top view diagram of the memory card 1 after the memory chip 11 and controller chip 12 are mounted. FIG. 3 is a top view diagram of the memory card 1 after the substrate pads 3 have been connected via a bonding wire 13 with the memory chip 11 and the controller chip 12. FIG. 4 is a cross section diagram of the line B-B' in FIG. 3.

As is shown in FIG. 4, in the memory card 1, the whole of the substrate 2 including the electrical parts 4 which are mounted on the substrate 2, and the fuse 6, are sealed by a resin mold 15. In addition, the memory card 1 is formed as a single body in the shape of a card by the resin mold 15. The memory card 1 can be connected to a variety of hand held electrical devices such as mobile phones, personal digital assistances and hand held computers by inserting the card into a memory card slot installed in these devices. As a result, the substrate pads 3 which are shown on the right side of the memory card in FIG. 3 are connected to connection terminals within a memory card slot of a hand held electrical device and are exposed since they are not sealed by the resin mold 15.

An SD card, for example, is used as a memory card in the above stated hand held electrical devices. Because an SD card is compatible with the miniaturization and high functionality of hand held electrical devices, development of large capacity and miniaturization of the SD card is progressing. An SD card has three types of external shape, from the largest to the smallest, an SD memory card, a miniSD card (trademark) and a microSD card (trademark). The external dimensions of the microSD card are width 11 mm, length 15 mm and thickness 1.0 mm, which are about one tenth of the external dimensions of the SD memory card and about one quarter of the external dimensions of the miniSD card. Thus, because the microSD card is compact and thin, it is widely used as an expansion memory in such mobile phones.

In addition, because the development of large capacity is progressing within the compact and thin package stated above, the technology for stacking a plurality of memory chips within a microSD card is also progressing. However, by reducing size and thickness, the mechanical strength of the package decreases. When this occurs, it is possible that the package or internal components may be damaged when an external force greater than this mechanical strength is applied to the card. As is shown in FIG. 4, in the package which is formed as a single body by the resin mold 15, even if no defects occur on the outside appearance of the package or operation of the internal components when an external force is applied, there is a possibility that cracks or damage in a part of the internal chip or substrate may occur. In this case, an overcurrent which exceeds an allowable current may flow in the places where these cracks or damage occur.

The memory card 1 related to the first embodiment is structured to prevent the flow of an overcurrent which exceeds an allowable current where cracks or damage occur in parts such as the internal chip or substrate when the package is applied with an external force as explained above. That is, as shown in the block diagram in FIG. 5, the fuse 6 is mounted near the power supply connector 3A among the substrate pads 3, and the card has a structure in which a power supply line 16 which supplies a power voltage to the memory chip 11 and the controller chip 12, is connected via the fuse 6. 3B in the diagram is a GND terminal. Furthermore, FIG. 5 is block diagram for functionally explaining the mounting position of the fuse 6 in the memory card 1.

Figure 6:
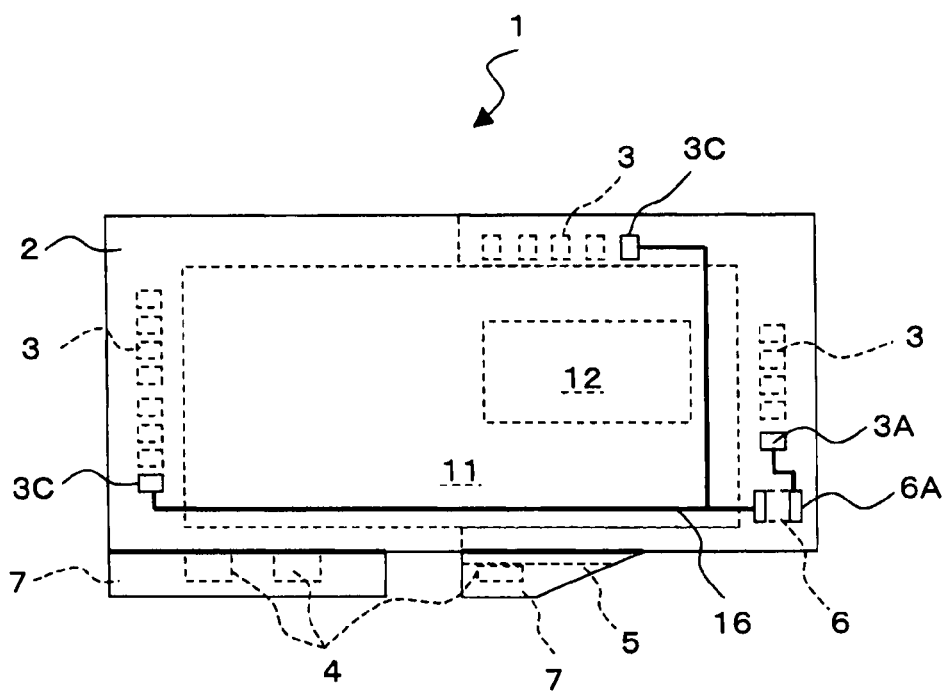
FIG. 6 is a top view diagram which shows a wiring pattern on the back surface of a memory card related to a first embodiment.

FIG. 6 is a top view diagram showing the back surface of the substrate 2 of the memory card 1 in FIG. 3. FIG. 6 is a diagram for showing how the power supply line 16 on the back surface of the substrate 2 which corresponds to the mounting position of the fuse 6 in FIG. 3, appears. In FIG. 6, a power supply connector 3A (a first power supply connector) which conducts electricity with the power supply connector 3A formed on the front surface of the substrate 2, is formed in the back surface. On the back surface of the fuse 6 which is mounted near this power supply connector 3A, fuse terminals 6A which conduct electricity with both ends of the fuse 6, are formed. One of the fuse terminals 6A is connected to the power supply connector 3A and the other fuse terminal 6A is connected to the power supply line 16 which supplies a power supply voltage to the memory chip 11 and the controller chip 12. In addition, a power supply connector 3C (a second power supply connector) which connects the power supply line 16 which supplies a power supply voltage to the memory chip 11 and the controller chip 12 is formed on the back surface of the substrate 2.

Next, the method of manufacturing the memory card 1 will be explained while referring to FIG. 1 to FIG. 4. First, in FIG. 1, the plurality of electrical parts 4 are mounted on the protrusion 7 of the substrate 2 and the fuse 6 is mounted on the outside element mounting area 5. Next, a wafer (not shown in the diagram) on which a plurality of memory chips 11 and the controller chip 12 is formed is ground to a desired thickness by a back surface grinding process and then cut out in the shape of a chip. The memory chips 11 and controller chip 12 which are cut out are stacked within the element mounting area of the substrate 2 (see FIG. 2). Next, a plurality of terminals of the memory chip 11 and the controller chip 12 and the plurality of substrate pads 3 are connected via the bonding wire 13 (see FIG. 3). Next, the electrical parts 4, the fuse 6, the memory chip 11 and the controller chip 12 and the whole of the substrate 2 are sealed by the resin mold 15 (see FIG. 4). Furthermore, in FIG. 4, 14 is a terminal section formed on the back surface of the substrate 2. This terminal section 14 is exposed since it is not sealed by the resin mold 15. This terminal section 14 is for connecting with the internal terminal section (not shown in the diagram) of the memory card slot of an electrical device.

Figure 5:
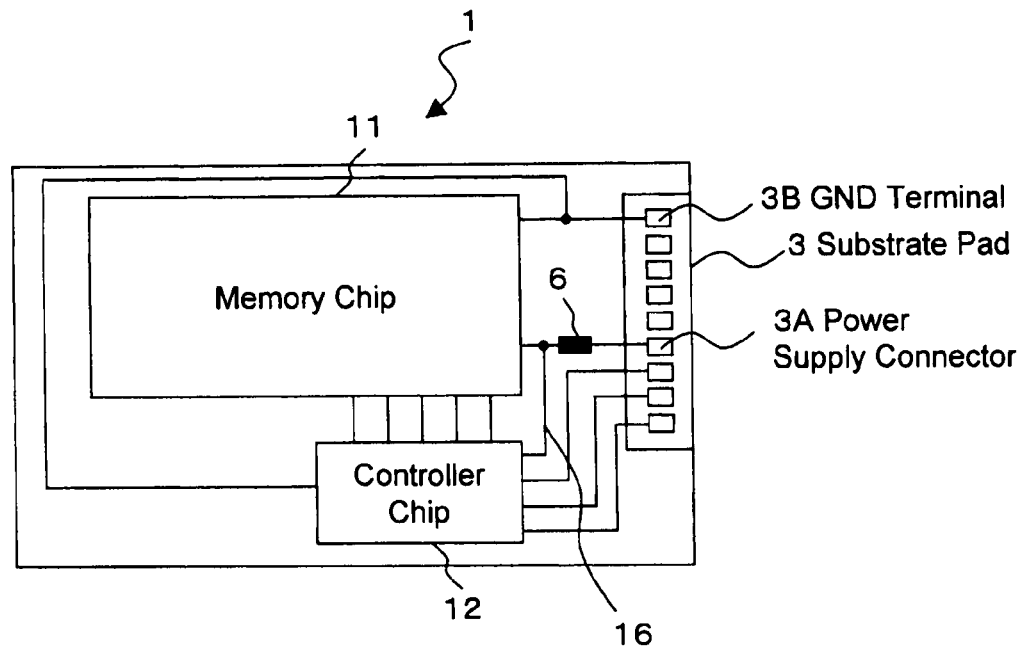
FIG. 5 is a block diagram which shows a circuit structure within a memory card related to a first embodiment.

As is shown in FIG. 5 and FIG. 6, the fuse 6 is mounted near the power supply connector 3A on the front surface of the substrate 2 in the memory card 1 related to the first embodiment. In addition, the memory card 1 has a structure which enables the power supply line 16 which supplies a power supply voltage to the memory chip 11 and the controller chip 12 via the fuse 6 to be connected.

As explained above, when an external force is applied to the package of the memory card 1, an overcurrent which exceeds an allowable current may flow in places in which cracks or damage occur in parts of the internal chip or substrate. In this case, when the amount of this overcurrent exceeds the allowable current level of the fuse 6, the fuse 6 melts and breaks and the power supply voltage is cut off. Therefore, it is possible to prevent this overcurrent from continuing to flow to the memory chip 11 and the controller chip 12 within the memory card 1 and also prevent an increase in temperature over the whole package of the memory card 1.

As a result, by applying the structure of the memory card 1 related to the first embodiment to the small and thin microSD card explained above, it is possible to improve the reliability of the microSD card.

Second Embodiment

In the second embodiment an example in which the mounting position of the fuse 6 is changed in the memory card 1 related to the first embodiment will be explained.

Figure 7:
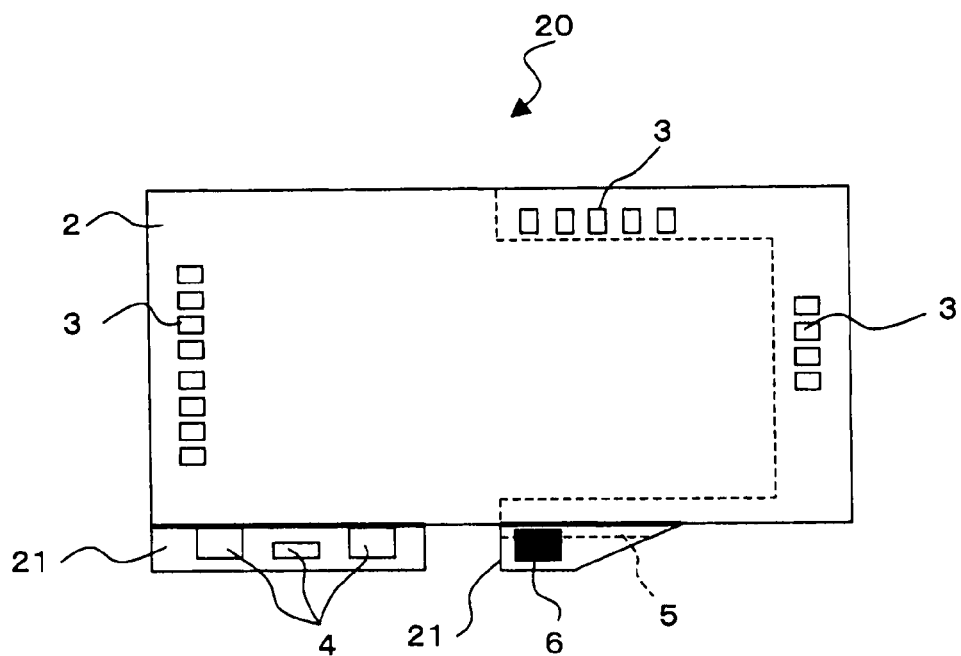
FIG. 7 is a top view diagram which shows a memory card before a memory chip and a controller chip are mounted related to a second embodiment.
Figure 8:
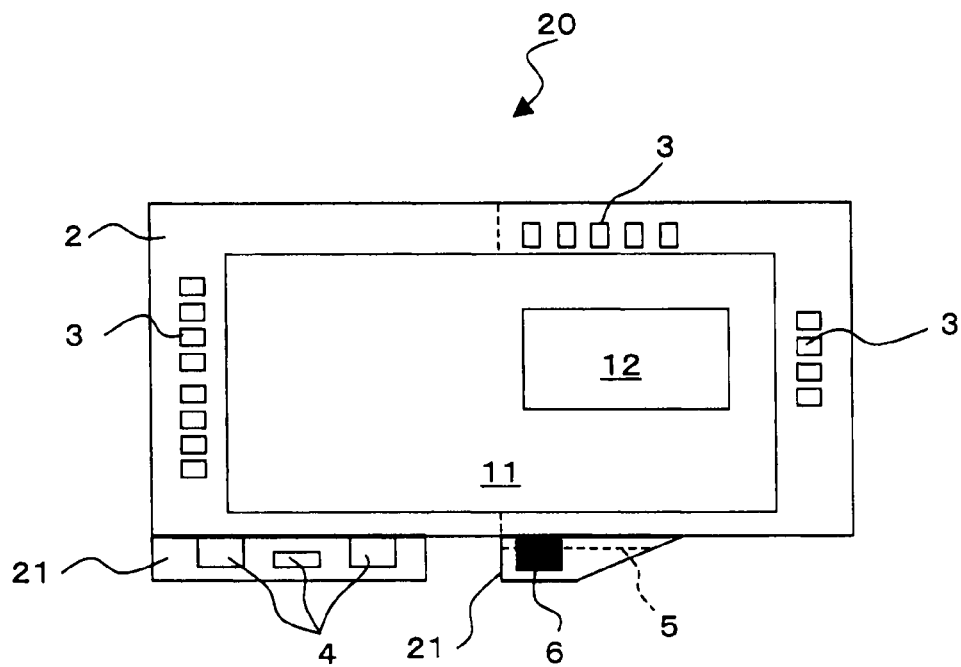
FIG. 8 is a top view diagram which shows a memory card after a memory chip and a controller chip are mounted related to a second embodiment.
Figure 9:
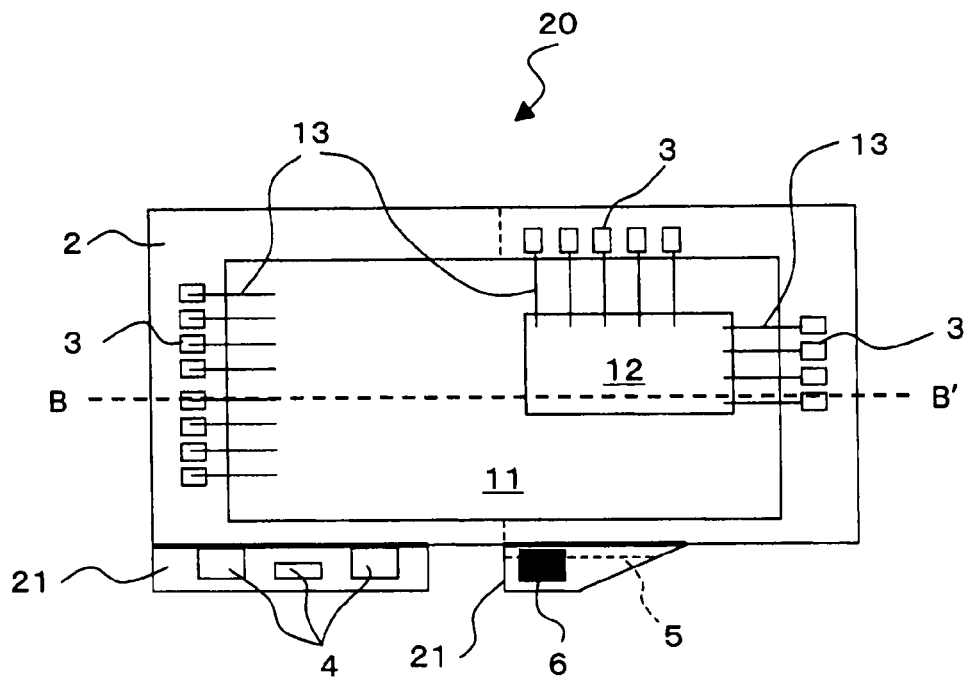
FIG. 9 is a top view diagram which shows a memory card after a bonding wire is connected related to a second embodiment.
Figure 10:
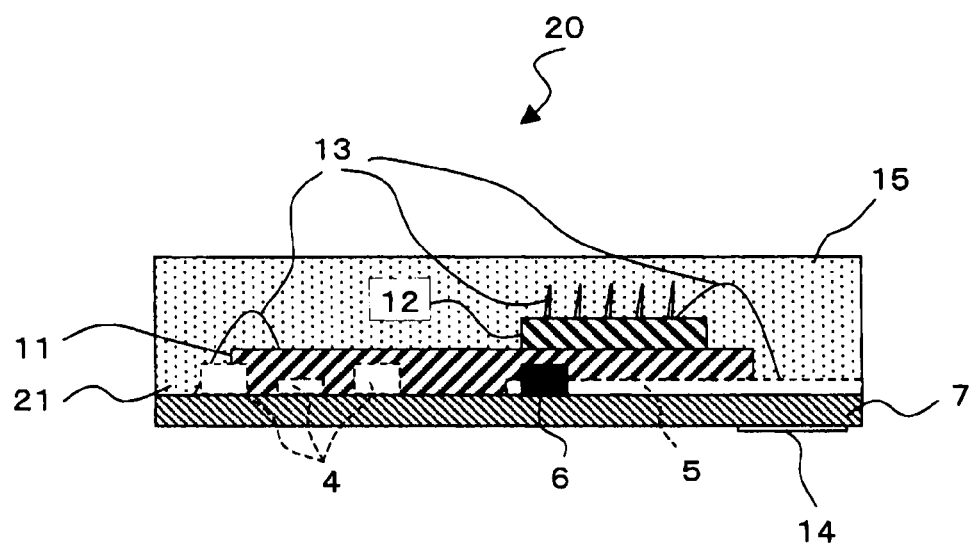
FIG. 10 is a cross sectional diagram which shows a memory card which is sealed by a resin mold related to a second embodiment.

FIG. 7 is a top view diagram of a memory card 20 before the memory chip 11 and the controller chip 2 are mounted. FIG. 8 is a top view diagram of the memory card 20 after the memory chip 11 and the controller chip 12 are mounted. FIG. 9 is a top view diagram of the memory card 20 after the substrate pads 3, the memory chip 11 and the controller chip 12 are connected by the bonding wire 13. FIG. 10 is cross sectional diagram of the line B-B' in FIG. 9. Furthermore, the structural parts in FIG. 7 to FIG. 10 which are the same as in the memory card 1 shown in FIG. 1 to FIG. 4 explained above, have the same symbols.

As is shown in FIG. 7 and FIG. 8, the memory card 20 related to the second embodiment is arranged with a substrate 2, a plurality of substrate pads 3 which are formed on the outside of element mounting area 5, a plurality of electrical parts 4 and a fuse 6 which are mounted on a protrusion 21 of the substrate 2, a memory chip 11 mounted within an element mounting area and a controller chip 12 stacked on a layer above the memory chip 11. In addition, as is shown in FIG. 9, a plurality of terminals (not shown in the diagram) of the memory chip 11 and the controller chip 12 and a plurality of the substrate pads 3 are connected by a bonding wire 13.

As is shown in FIG. 10, in the memory card 20, the whole of the substrate 2 including the electrical parts 4 and the fuse 6 which are mounted on the substrate 2, are sealed by a resin mold 15. In addition, the memory card 20 is formed as a single body in the shape of a card by the resin mold 15. The memory card 20 can be connected to a variety of hand held electrical devices such as mobile phones, personal digital assistances and hand held computers, by inserting the card into a memory card slot installed in these devices. As a result, the substrate pads 3 which are shown on the right side of the memory card 20 in FIG. 9 are connected to connection terminals within a memory card slot of a hand held electrical device and are exposed since they are not sealed by the resin mold 15.

Figure 11:
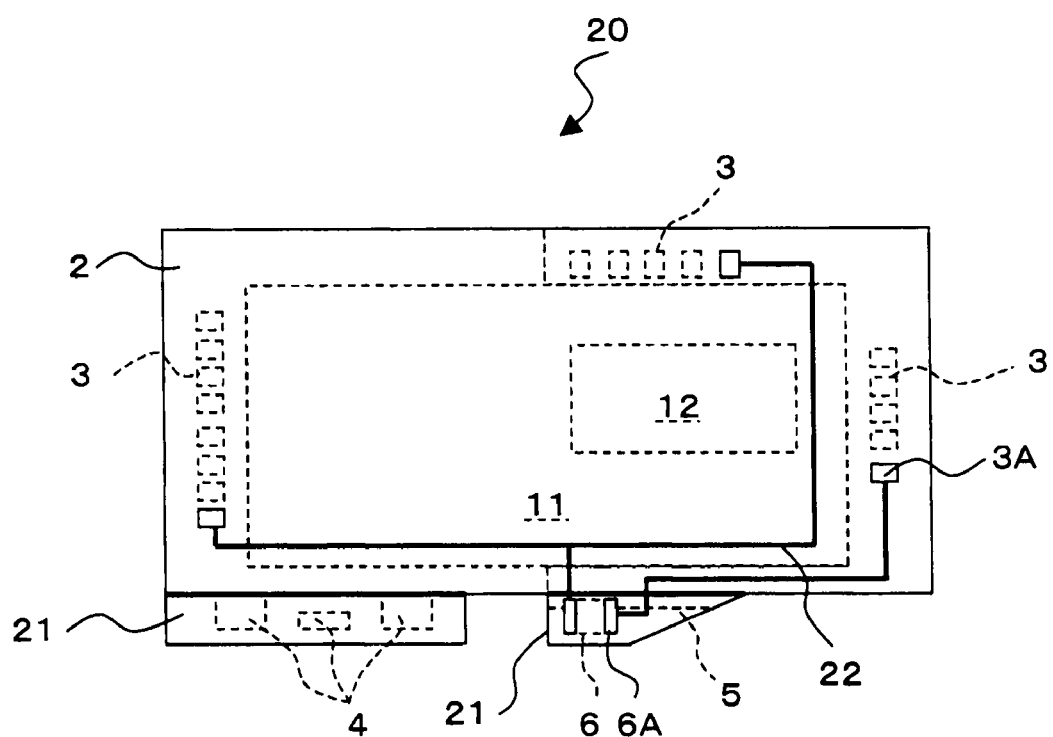
FIG. 11 is a top view diagram which shows a wire pattern on the back surface of a memory card related to a second embodiment.

FIG. 11 is a top view diagram showing the back surface of the substrate 2 of the memory card 20 in FIG. 9. FIG. 11 is a diagram for showing how the power supply line 22 on the back surface of the substrate 2 which corresponds to the mounting position of the fuse 6 in FIG. 9, appears. In FIG. 11, a power supply connector 3A (a first power supply connector) which conducts electricity with the power supply terminal formed on the front surface side of the substrate 2, is formed on the back surface. On the back surface side of the fuse 6 which is mounted on the protrusion 21, fuse terminals 6A which conduct electricity with both ends of the fuse 6, are formed. One of the fuse terminals 6A is connected to the power supply connector 3A and the other fuse terminal 6A is connected to the power supply line 22 which supplies a power supply voltage to the memory chip 11 and the controller chip 12. Furthermore, because the block structure of the memory card 20 is the same as that shown in FIG. 5, a diagram and explanation are omitted. In addition, because the method for manufacturing the memory card 20 has the same procedure as the manufacturing method explained in the first embodiment, an explanation is omitted.

As is shown in FIG. 11, the memory card 20 related to the second embodiment has a structure in which the fuse 6 is mounted on the protrusion 21 on the front surface of the substrate 2 and the power supply line 22 which supplies a power supply voltage to the memory chip 11 and the controller chip 12 via the fuse 6 is connected.

As explained above, when an external force is applied to the package of the memory card 20, an overcurrent which exceeds an allowable current may flow in places in which cracks or damage occur in parts of the internal chip or substrate. In this case, when the amount of this overcurrent exceeds the allowable current level of the fuse 6, the fuse 6 melts and breaks and the power supply voltage is cut off. Therefore, it is possible to prevent this overcurrent from continuing to flow to the memory chip 11 and the controller chip 12 within the memory card 20 and also prevent an increase in temperature over the whole package of the memory card 20.

As a result, by applying the structure of the memory card 20 related to the second embodiment to the small and thin microSD card explained above, it is possible to improve the reliability of the microSD card. In addition, the fuse 6 is mounted on the protrusion 21 of the substrate 2 in the memory card 20 related to the second embodiment. As a result, as shown in the first embodiment, even when the fuse 6 can not be mounted on the outside element mounting area and near the power supply connector 3A, it is still possible to mount the fuse 6.

Third Embodiment

In the third embodiment, a different example to the memory card 1 and the memory card 20 related to the first and second embodiments is explained in which a fuse is mounted on a memory card which is stacked with a plurality of memory chips in steps.

Figure 12:
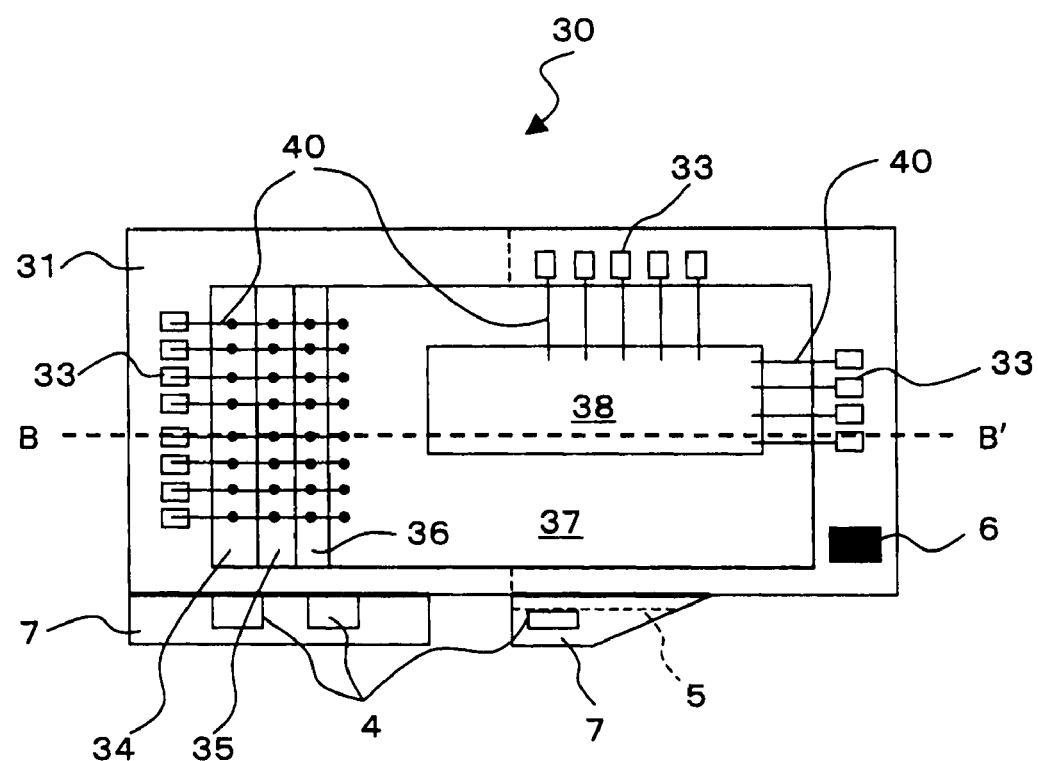
FIG. 12 is a top view diagram which shows the whole structure of a memory card on which a plurality of memory chips are stacked in steps related to a third embodiment.
Figure 13:
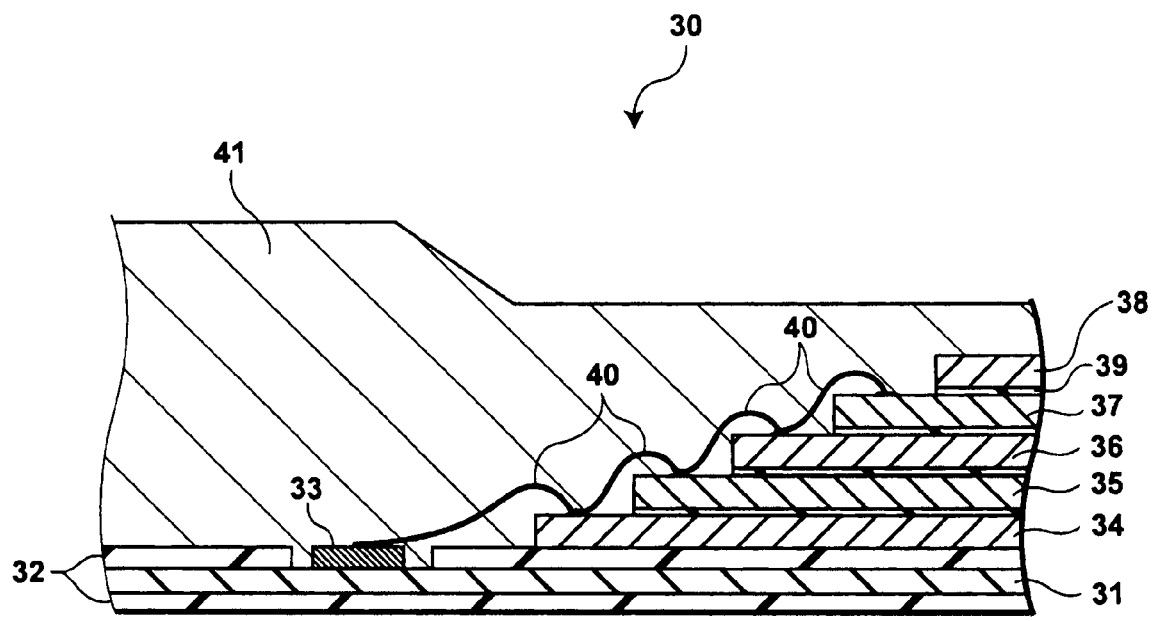
FIG. 13 is a cross sectional diagram which shows one part of a memory card on which a plurality of memory chips are stacked in steps related to a third embodiment.

FIG. 12 is a top view diagram which shows the whole structure of a memory card 30 which is mounted with a plurality of memory chips 34 to 37 and a controller chip 38 which are stacked in steps. FIG. 13 is a cross sectional diagram of the line B-B' in FIG. 12. Furthermore, in FIG. 12 and FIG. 13, the same structural parts as in the memory card 1 which is shown in FIG. 1 to FIG. 4 explained above, have the same symbols.

As is shown in FIG. 12 and FIG. 13, the memory card 30 related to the third embodiment is arranged with a substrate 31, a plurality of substrate pads 33 which are formed on an outside of element mounting area 5, a plurality of electrical parts 4 which are mounted on a protrusion 7 of the substrate 31, a fuse 6 which is mounted near a power supply connector 3A (see FIG. 6) on the outside of element mounting area 5, memory chips 34 to 37 stacked in steps within an element mounting area and a controller chip 38 stacked on a layer above the memory chip 37. In addition, a plurality of terminals of the memory chips 34 to 37 and the controller chip 38 and the plurality of substrate pads 33 are connected by a bonding wire 40. As is shown in FIG. 13, excluding the substrate pads 33, an insulation film 32 is formed on the front surface and back surface of the substrate 31. In addition, as in shown in FIG. 13, the memory chips 34 to 37 and the controller chip 38 are stacked with an insulation film 39 formed between the chips. Furthermore, because the block structure of the memory card 30 is basically the same as that shown in FIG. 5, a diagram and explanation are omitted. In addition, because the power supply line 16 which is formed on the back surface of the substrate 31 of the memory card 30 is the same as that shown in the first embodiment explained above, a diagram and explanation are omitted.

Next, the method of manufacturing the memory card 30 will be explained while referring to FIG. 12 and FIG. 13. First, in FIG. 12, the plurality of electrical parts 4 are mounted on the protrusion 7 of the substrate 31 and the fuse 6 is mounted near the power supply connector 3A and on the outside of element mounting area 5. Next, a wafer (not shown in the diagram) on which the plurality of memory chips 34 to 37 and the controller chip 38 are formed is ground to a desired thickness by a back surface grinding process and then cut out in the shape of a chip. The memory chips 34 to 37 and controller chip 38 which are cut out are stacked in steps with the insulation film 39 formed between the chips within the element mounting area of the substrate 31 (see FIG. 13). Next, the plurality of terminals of the memory chips 34 to 37 and the controller chip 38 and the plurality of substrate pads 33 are connected via the bonding wire 40 (see FIG. 12). Next, the electrical parts 4, the fuse 6, the memory chips 34 to 37 and the controller chip 38 and the whole of the substrate 31 are sealed by a resin mold 41 (see FIG. 13).

As is shown in FIG. 12, the memory card 30 related to the third embodiment has a structure in which the fuse 6 is mounted on the outside of element mounting area 5 of the front surface of the substrate 31 and near the power supply connector 3A, and the power supply line 16 which supplies a power supply voltage to the memory chips 34 to 37 and the controller chip 38 via the fuse 6 is connected.

As explained above, when an external force is applied to the package of the memory card 30, an overcurrent which exceeds an allowable current may flow in places in which cracks or damage occur in parts of the internal chip or substrate. In this case, when the amount of this overcurrent exceeds the allowable current level of the fuse 6, the fuse 6 melts and breaks and the power supply voltage is cut off. Therefore, it is possible to prevent this overcurrent from continuing to flow to the memory chips 34 to 37 and the controller chip 38 within the memory card 30 and also prevent an increase in temperature over the whole package of the memory card 30.

As a result, by applying the structure of the memory card 30 related to the third embodiment to the small and thin microSD card explained above, it is possible to improve the reliability of the microSD card. Furthermore, in the memory card 30 related to the third embodiment, the fuse 6 is shown mounted near the power supply connector 3A and on the outside of element mounting area on the front surface of the substrate 31 as shown in FIG. 12, however, as in the second embodiment explained above, the fuse 6 may also be mounted on the protrusion 21. An example of mounting the fuse 6 on the protrusion 21 is shown in FIG. 14.

Figure 14:
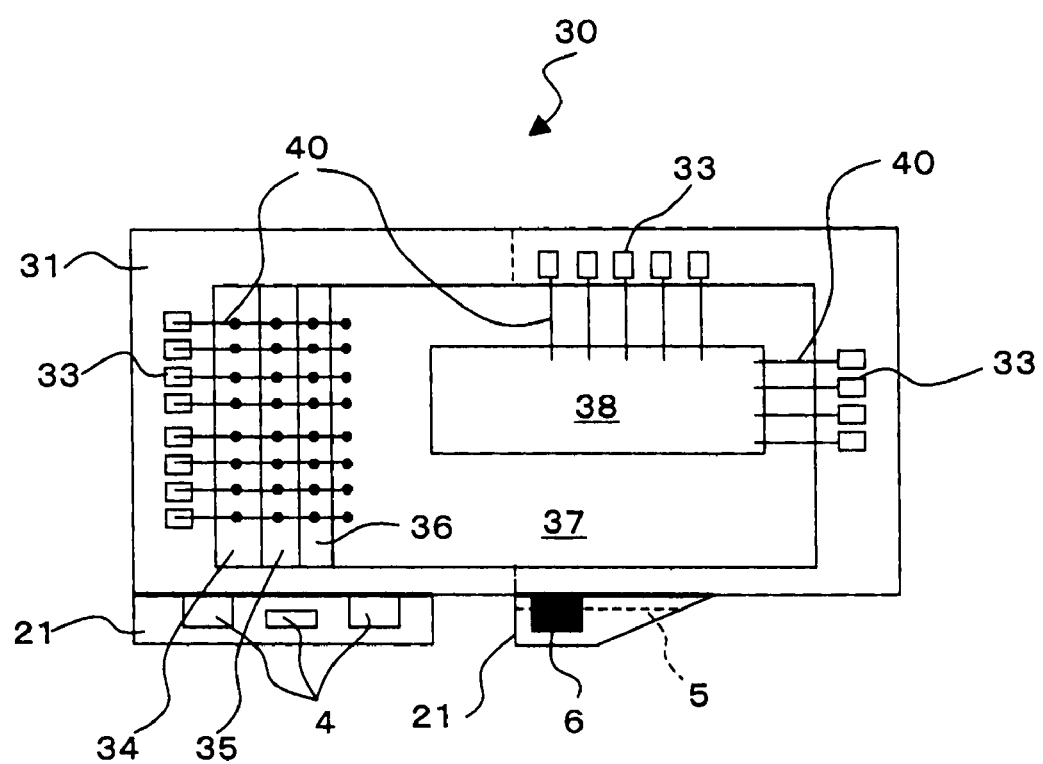
FIG. 14 is a top view diagram which shows the whole structure of another memory card on which a plurality of memory chips are stacked in steps related to a third embodiment.

FIG. 14 is a top view diagram which shows the whole structure of the memory card 30 when the fuse 6 is mounted on the protrusion 21 of the memory card 30 which is mounted with the plurality of memory chips 34 to 37 stacked in steps as shown in FIG. 12. Furthermore, because the block structure of the memory card 30 is basically the same as that shown in FIG. 5, a diagram and explanation are omitted. In addition, because the power supply line 22 which is formed on the back surface of the substrate 31 of the memory card 30 is the same as that shown in the first embodiment explained above, a diagram and explanation are omitted.

As in the memory card 30 shown in FIG. 12, when an external force is applied to the package of the memory card 30 shown in FIG. 14, an overcurrent which exceeds an allowable current may flow in places in which cracks or damage occur in parts of the internal chip or substrate. In this case, when the amount of this overcurrent exceeds the allowable current level of the fuse 6, the fuse 6 melts and breaks and the power supply voltage is cut off. Therefore, it is possible to prevent this overcurrent from continuing to flow to the memory chips 34 to 37 and the controller chip 38 within the memory card 30 and also prevent an increase in temperature over the whole package of the memory card 30.

Fourth Embodiment

In the fourth embodiment, a different example to the memory card 30 related to the third embodiment is explained in which a fuse is mounted on a memory card which is mounted with a plurality of memory chips stacked directly above each other.

Figure 15:
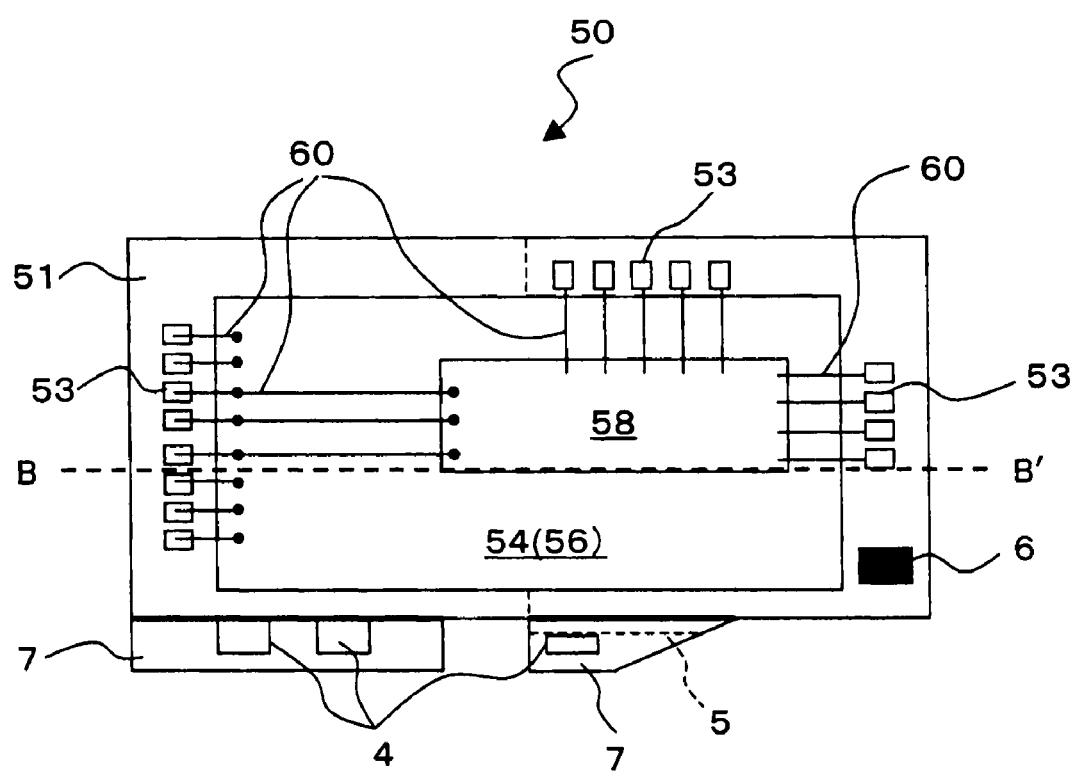
FIG. 15 is a top view diagram which shows the whole structure of a memory card on which a plurality of memory chips are stacked related to a fourth embodiment.
Figure 16:
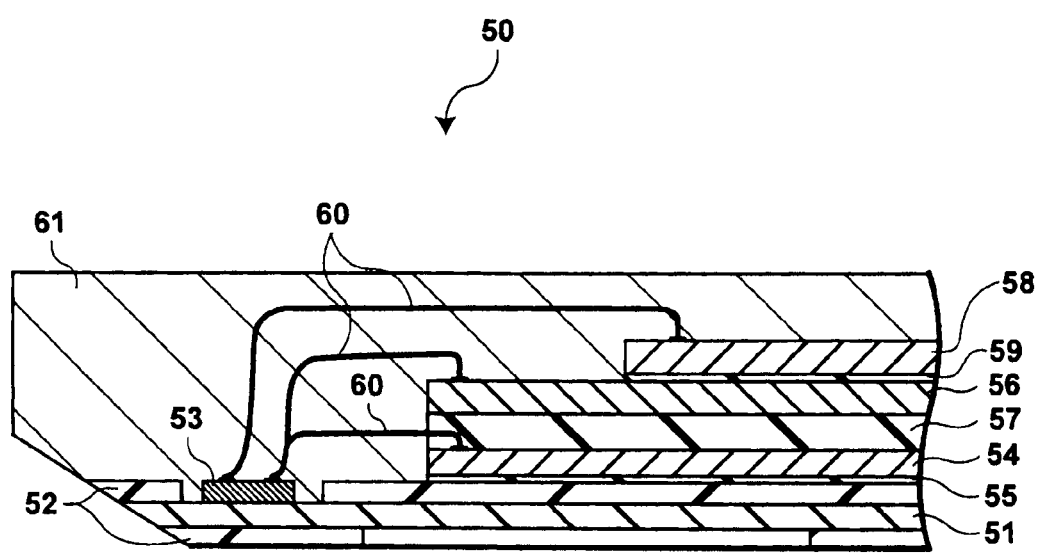
FIG. 16 is a top view diagram which shows the whole structure of a memory card on which a plurality of memory chips are stacked related to a fourth embodiment.

FIG. 15 is a top view diagram which shows the whole structure of a memory card 50 which is mounted with a plurality of memory chips 54 and 56 and a controller chip 38 which are stacked directly above each other. FIG. 16 is a cross sectional diagram of the line B-B' in FIG. 15. Furthermore, in FIG. 15 and FIG. 16, the same structural parts as in the memory card 1 which is shown in FIG. 1 to FIG. 4 explained above, have the same symbols.

As is shown in FIG. 15 and FIG. 16, the memory card 50 related to the fourth embodiment is arranged with a substrate 51, a plurality of substrate pads 53 which are formed on an outside of element mounting area 5, a plurality of electrical parts 4 which are mounted on a protrusion 7 of the substrate 51, a fuse 6 which is mounted near a power supply connector 3A (see FIG. 6) on the outside of element mounting area 5, memory chips 54 and 56 stacked directly above each other within an element mounting area and a controller chip 58 stacked on a layer above the memory chip 56. In addition, a plurality of terminals of the memory chips 54 and 56 and the controller chip 58 and the plurality of substrate pads 53 are connected by a bonding wire 60. As is shown in FIG. 16, excluding the substrate pads 53, an insulation film 52 is formed on the front surface and back surface of the substrate 51. In addition, as in shown in FIG. 16, the memory chips 54 and 56 and the controller chip 58 are stacked with the insulation films 55, 57 and 59 formed between the chips. Furthermore, because the block structure of the memory card 50 is basically the same as that shown in FIG. 5, a diagram and explanation are omitted. In addition, because the power supply line 16 which is formed on the back surface of the substrate 51 of the memory card 50 is the same as that shown in the first embodiment explained above, a diagram and explanation are omitted.

Next, the method of manufacturing the memory card 50 will be explained while referring to FIG. 15 and FIG. 16. First, in FIG. 15, the plurality of electrical parts 4 are mounted on the protrusion 7 of the substrate 51 and the fuse 6 is mounted near the power supply connector 3A and on the outside of element mounting area 5. Next, a wafer (not shown in the diagram) on which the plurality of memory chips 54 and 56 and the controller chip 58 are formed is ground to a desired thickness by a back surface grinding process and then cut out in the shape of a chip. The memory chips 54 and 56 and the controller chip 58 which are cut out are stacked directly above each other with the insulation films 55, 57 and 59 formed between the chips within the element mounting area of the substrate 51 (see FIG. 16). Next, a plurality of terminals of the memory chips 54 and 56 and the controller chip 58 and the plurality of substrate pads 53 are connected via the bonding wire 60 (see FIG. 15). Next, the electrical parts 4, the fuse 6, the memory chips 54 and 56 and the controller chip 58 and the whole of the substrate 51 are sealed by a resin mold 61 (see FIG. 16).

As is shown in FIG. 15, the memory card 50 related to the fourth embodiment has a structure in which the fuse 6 is mounted near the power supply connector 3A and on the outside of element mounting area 5 of the front surface of the substrate 51 and near the power supply connector 3A, and the power supply line 16 which supplies a power supply voltage to the memory chips 54 and 56 and the controller chip 58 via the fuse 6 is connected.

As explained above, when an external force is applied to the package of the memory card 50, an overcurrent which exceeds an allowable current may flow in places in which cracks or damage occur in parts of the internal chip or substrate. In this case, when the amount of this overcurrent exceeds the allowable current level of the fuse 6, the fuse 6 melts and breaks and the power supply voltage is cut off. Therefore, it is possible to prevent this current from continuing to flow to the memory chips 54 and 56 and the controller chip 58 within the memory card 50 and also prevent an increase in temperature over the whole package of the memory card 50.

As a result, by applying the structure of the memory card 50 related to the fourth embodiment to the small and thin microSD card explained above, it is possible to improve the reliability of the microSD card. Furthermore, in the memory card 50 related to the fourth embodiment, the fuse 6 is shown mounted near the power supply connector 3A and on the outside element mounting area 5 of the front surface of the substrate 51 and near the power supply connector 3A as shown in FIG. 15, however, as in the second embodiment explained above, the fuse 6 may also be mounted on the protrusion 21. An example of mounting the fuse 6 on the protrusion 21 is shown in FIG. 17.

Figure 17:
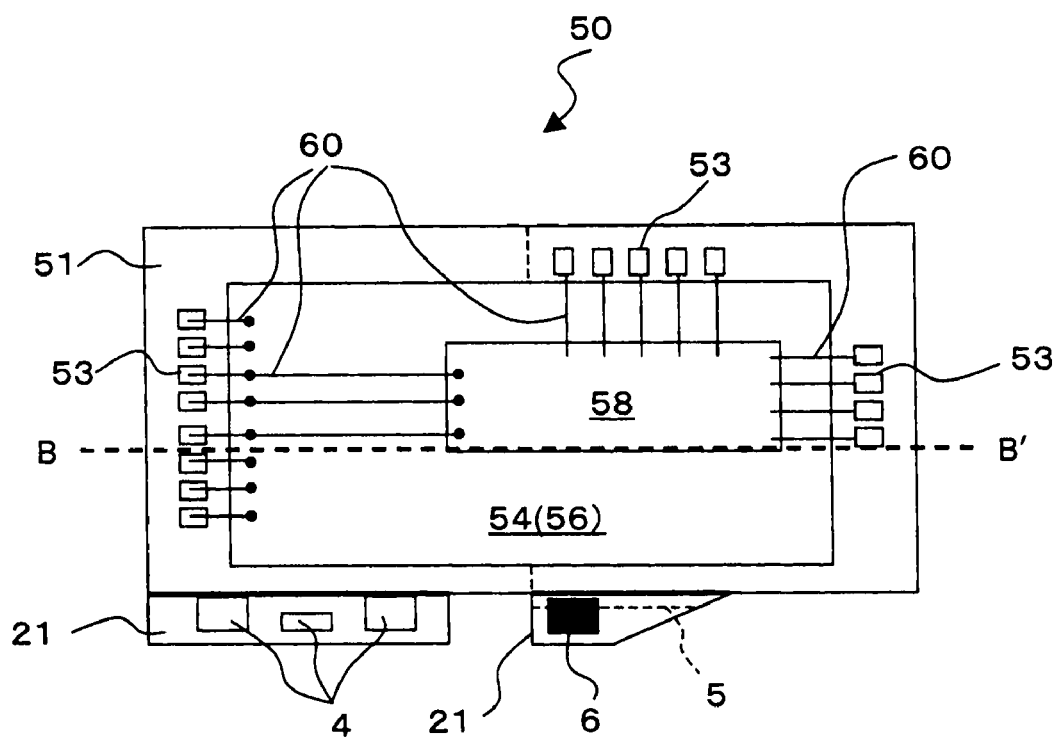
FIG. 17 is a top view diagram which shows the whole structure of another memory card on which a plurality of memory chips are stacked related to a fourth embodiment.

FIG. 17 is a top view diagram which shows the whole structure of the memory card 50 when the fuse 6 is mounted on the protrusion 21 of the memory card 50 which is mounted with the plurality of memory chips 54 and 56 stacked directly above each other as shown in FIG. 15. Furthermore, because the block structure of the memory card 50 is basically the same as that shown in FIG. 5, a diagram and explanation are omitted. In addition, because the power supply line 22 which is formed on the back surface of the substrate 51 of the memory card 50 is the same as that shown in the first embodiment explained above, a diagram and explanation are omitted.

As in the memory card 50 shown in FIG. 17, when an external force is applied to the package of the memory card 50 shown in FIG. 15, an overcurrent which exceeds an allowable current may flow in places in which cracks or damage occur in parts of the internal chip or substrate. In this case, when the amount of this overcurrent exceeds the allowable current level of the fuse 6, the fuse 6 melts and breaks and the power supply voltage is cut off. Therefore, it is possible to prevent this current from continuing to flow to the memory chips 54 and 56 and the controller chip 58 within the memory card 50 and also prevent an increase in temperature over the whole package of the memory card 50.

Figure 18:
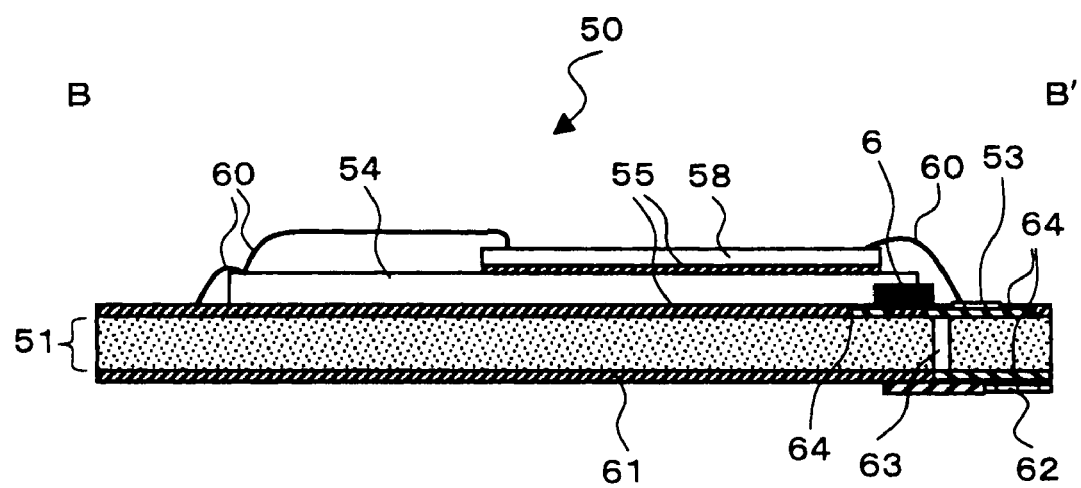
FIG. 18 is a cross sectional diagram which shows the whole structure of another memory card related to a fourth embodiment.

FIG. 18 is a cross sectional diagram which shows the whole structure of the memory card 50 when the fuse 6 is mounted near the substrate pads 53 of the memory card 50 which is mounted with the memory chip 54 and the controller chip 58 stacked directly above the memory chip 54 as shown in FIG. 15. Furthermore, because the block structure of the memory card 50 is basically the same as that shown in FIG. 5, a diagram and explanation are omitted. In addition, because the power supply line 22 which is formed on the back surface of the substrate 51 of the memory card 50 is the same as that shown in the first embodiment explained above, a diagram and explanation are omitted. Furthermore, in FIG. 18, the structural parts which are the same as in the memory card 50 shown in FIG. 15 have the same symbols.

In the memory card 50 shown in FIG. 18, the memory chip 54 and the controller chip 58 are stacked on the substrate 51 with an insulation film 55 formed between the chips. 61 is an insulation film which covers the whole back surface of the substrate 51. An external terminal 62 is formed on the right end part of the back surface of the substrate 51 which is not covered by the insulation film 61. A copper wiring 64 is formed directly above the external terminal 62 and on a layer (front surface of the substrate 51) above a contact plug 63 which passes through the substrate 51. The substrate pad 53 is formed directly above the copper wiring 64 which is formed on the front surface of the substrate 51. The copper wiring 64 which is formed on the front surface of the substrate 51 is divided into a copper wiring 64 (right end part of the diagram) which is electrically connected with the substrate pad 53, and a copper wiring 64 (bottom left of the fuse 6 in the diagram) which is electrically connected with the above stated copper wiring 64 via the fuse 6. The substrate pad 53 is electrically connected to the external terminal 62 via the copper wiring 64 and the contact plug 63.

By the structure explained above, the fuse 6 is mounted near the substrate pad 53 which is connected with the external terminal 62 and the internal copper wiring 64 is electrically connected with the external terminal 62 and the substrate pad 53 via the fuse 6. As in the memory card 50 shown in FIG. 18, when an external force is applied to the package of the memory card 50 shown in FIG. 18, an overcurrent which exceeds an allowable current may flow in places in which cracks or damage occur in parts of the internal chip or substrate. In this case, when the amount of this overcurrent exceeds the allowable current level of the fuse 6, the fuse 6 melts and breaks and the power supply voltage is cut off. Therefore, it is possible to prevent this overcurrent from continuing to flow to the memory chip 54 and the controller chip 58 within the memory card 50 and also prevent an increase in temperature over the whole package of the memory card 50.

Figure 19:
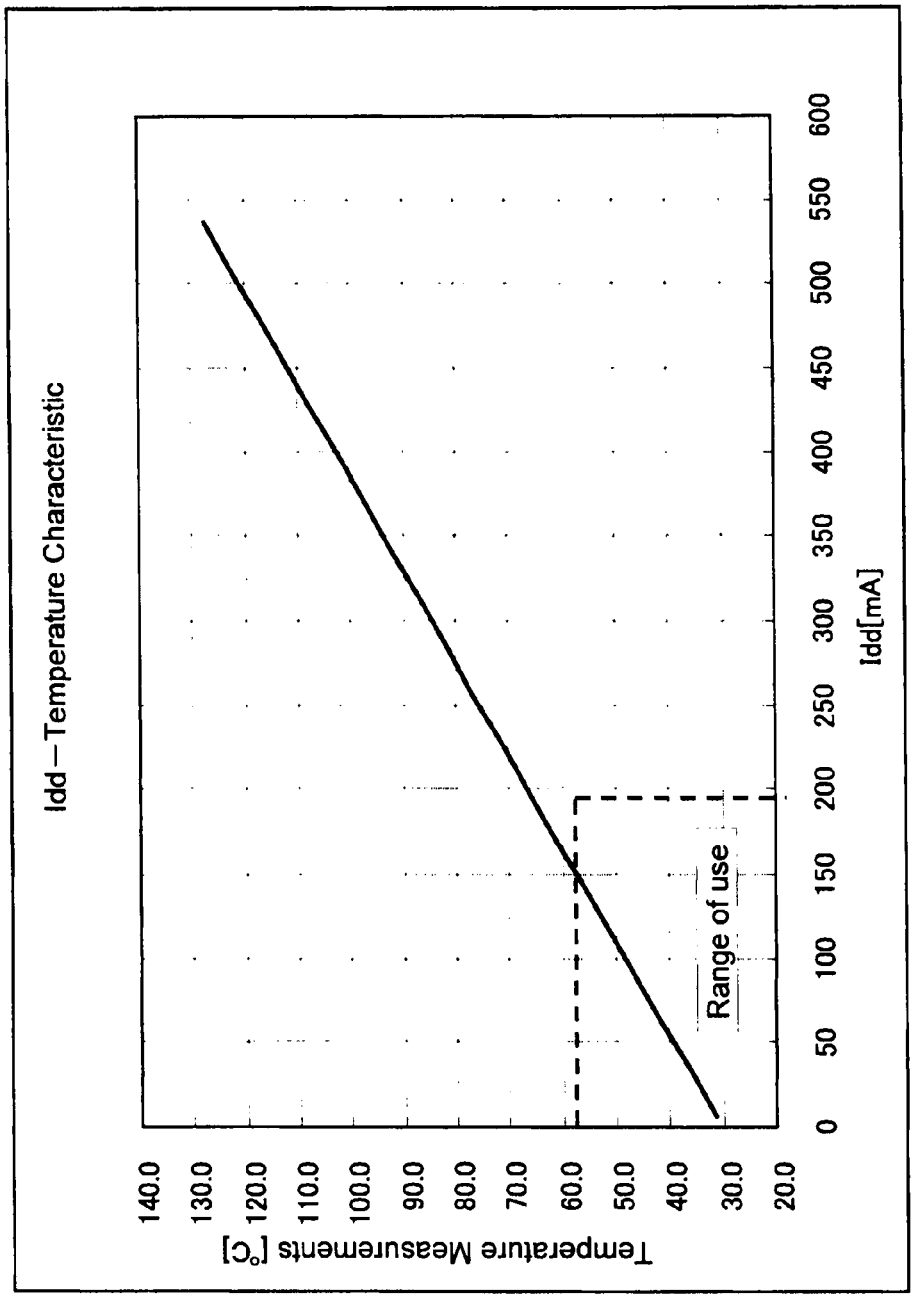
FIG. 19 is a diagram which shows examples of the characteristics of an overcurrent Idd and a temperature measurement value in a memory card related to a fourth embodiment.

An example in which the overcurrent level and package temperature are measured in the memory cards 1, 30 and 50 shown in the first to fourth embodiments explained above, is shown in FIG. 19. FIG. 19 is one example of a characteristics graph in which the overcurrent Idd [mA] is set on the x axis and the temperature measurements [° C.] is set on the y axis. In this case, the range used is between 200 mA or less for the overcurrent Idd and about 60° C. or less for the measured temperature value of a package. That is, in the case where a overcurrent Idd flows at more than about 200 mA, the fuse 6 which melts and breaks is used. Furthermore, this graph is only one example and the specifications of the fuse 6 can be appropriately changed according to the operational current which flows in the memory chips mounted on the memory cards 1, 30 and 50.

In addition, in the case where the memory cards 1, 30, 50 shown in the first to fourth embodiments are applied to the microSD card described above, the dimensions of each part changes as follows. That is, the dimensions for fitting the memory cards 1, 30, 50 within the standard external dimensions of the microSD card which are width, 11 mm, length, 15 mm and thickness, 1.0 mm, are shown below.

(When Memory Card 1 is Applied)

The approximate dimensions of each part of the memory card 1 which is formed as a single body by the resin mold 15 with the memory chip 11 and the controller chip 12 stacked upon on each other; package overall thickness: approximately 700 μm, mold thickness: approximately 550 μm, substrate 2 thickness: approximately 170 μm, memory chip 11 thickness: approximately 150 μm, controller chip 12 thickness: approximately 120 μm, thickness of insulation film between chips: approximately 20 μm.

(When Memory Card 30 is Applied)

The approximate dimensions of each part of the memory card 30 which is formed as a single body by the resin mold 41 with the memory chips 34 to 37 and the controller chip 38 stacked in five steps; package overall thickness: approximately 700 μm, mold thickness: approximately 600 μm, substrate 31 thickness: approximately 120 μm, first step memory chip 34 thickness: approximately 80 μm, first step insulation film 39 thickness: approximately 20 μm, second step memory chip 35 thickness: approximately 70 μm, second step insulation film 39 thickness: approximately 10 μm, third step memory chip 36 thickness: approximately 70 μm, third step insulation film 39 thickness: approximately 10 μm, fourth step memory chip 37 thickness: approximately 70 μm, fourth step insulation film 39 thickness: approximately 10 μm, fifth step controller chip 38 thickness: approximately 70 μm.

(When Memory Card 50 is Applied)

The approximate dimensions of each part of the memory card 50 which is formed as a single body by the resin mold 61 with the memory chips 54 to 56 and the controller chip 58 stacked in three steps; package overall thickness: approximately 700 μm, mold thickness: approximately 550 μm, substrate 51 thickness: approximately 170 μm, first step memory chip 54 thickness: approximately 150 μm, first step insulation film 55 thickness: approximately 20 μm, second step memory chip 56 thickness: approximately 70 μm, second step insulation film 57 thickness: approximately 10 μm, third step controller chip 58 thickness: approximately 70 μm, third step insulation film 59 thickness: approximately 20 μm.

Furthermore, the approximate dimensions of the memory cards 1, 30 and 50 explained above are only for the case when they are applied to the microSD card, for example, in the case where the memory cards 1, 30 and 50 are applied to correspond to the SD memory card or the miniSD card, it is possible to appropriately change each external dimension. In addition, the approximate dimensions of the memory cards 1, 30 and 50 can also be changed to correspond to the external dimensions of a memory card based on alternative standards. In addition, the number of stacked layers of chips or the mounting position of the fuse 6 within the memory cards 1, 30 and 50 shown as examples in the first to fourth embodiments, is an example and the present invention is not limited to these structural requirements.

What is claimed is:

1. A memory card comprising:
   a plurality of semiconductor elements;
   a substrate on which said plurality of semiconductor elements are mounted, said substrate also having a plurality of terminals for connecting to external equipment; and
   a fuse mounted on the outside of a mounting area of said plurality of semiconductor elements and mounted on a surface of said substrate near a power supply terminal among said plurality of terminals;
   said power supply terminal and said plurality of semiconductor elements are connected via said fuse,
   wherein a first power supply connector which is electrically connected with said power supply terminal among said plurality of terminals, a fuse terminal which is electrically connected with both end parts of said fuse, and a second power supply connector which is electrically connected with a power supply input terminal of said plurality of semiconductor elements, are formed on the back surface of said substrate, and
   a power supply line is formed on the back surface of said substrate so that said first power supply connector and said second power supply connector are connected via said fuse.

2. The memory card according to claim 1, wherein said plurality of semiconductor elements are mounted by stacking on the front surface of said substrate,
   a plurality of bonding pads which connect said plurality of semiconductor elements and said plurality of terminals on said substrate are formed on the front surface of said substrate near said plurality of semiconductor elements,
   said power supply input terminal of said plurality of semiconductor elements and said plurality of bonding pads are connected via a bonding wire, and
   said plurality of semiconductor elements, said fuse and said substrate excluding said plurality of terminals are sealed by a resin mold and formed as a single body in the shape of a card.

3. The memory card according to claim 2, wherein
   said fuse is mounted near said power supply terminal among said plurality of terminals within an area in which said plurality of bonding pads are formed.

4. The memory card according to claim 2, wherein said fuse cuts off a power supply to said plurality of semiconductor elements when an overcurrent which flows in said fuse exceeds an allowable current level as a result of cracks or damage occurring in a part of one of the semiconductor elements or the substrate.

5. The memory card according to claim 4, wherein said allowable current level is less than 200 mA.

6. The memory card according to claim 2, wherein each layer of said plurality of semiconductor elements is thinner than said substrate, and each layer of said plurality of semiconductor elements becomes gradually thicker as said layers are stacked.

7. The memory card according to claim 2, wherein the thickness of said memory card sealed by a resin mold is less than 1 mm.

8. The memory card according to claim 2, wherein said memory card sealed by a resin mold is a micro SD card.

9. The memory card according to claim 1, wherein said semiconductor device includes a memory chip and a controller chip as said plurality of semiconductor elements and said controller chip is stacked on said memory chip.

10. A memory card comprising:
    a plurality of semiconductor elements;
    a substrate on which said plurality of semiconductor elements are mounted, said substrate also having a plurality of terminals for connecting to external equipment and a protrusion formed on a part of the periphery of said substrate on which other elements are mounted; and
    a fuse mounted on said protrusion;
    a power supply terminal among said plurality of terminals and said plurality of semiconductor elements are connected via said fuse,
    wherein a first power supply connector which is electrically connected with said power supply terminal among said plurality of said terminals, a fuse terminal which is electrically connected with both end parts of said fuse, and a second power supply connector which is electrically connected with a power supply input terminal of said plurality of semiconductor elements, are formed on the back surface of said substrate, and a power supply line is formed on the back surface of said substrate so that said first power supply connector and said second power supply connector are connected via said fuse.

11. The memory card according to claim 10, wherein said plurality of semiconductor elements are mounted by stacking on the front surface of said substrate, and a plurality of bonding pads which connect said plurality of semiconductor elements and said plurality of terminals on said substrate are formed on the front surface of said substrate near said plurality of semiconductor elements, said power supply input terminal of said plurality of semiconductor elements and said plurality of bonding pads are connected via a bonding wire, and said plurality of semiconductor elements, said fuse and said substrate excluding said plurality of terminals are sealed by a resin mold and formed as a single body in the shape of a card.

12. The memory card according to claim 11, wherein each layer of said plurality of semiconductor elements is thinner than said substrate, and each layer of said plurality of semiconductor elements becomes gradually thicker as said layers are stacked.

13. The memory card according to claim 11, wherein the thickness of said memory card sealed by a resin mold is less than 1 mm.

14. The memory card according to claim 11, wherein said memory card sealed by a resin mold is a micro SD card.

15. The memory card according to claim 10, wherein said memory card includes a memory chip and a controller chip as said plurality of semiconductor elements and said controller chip is stacked on said memory chip.

16. The memory card according to claim 10, wherein said fuse cuts off a power supply to said plurality of semiconductor elements when an overcurrent which flows in said fuse exceeds an allowable current level as a result of cracks or damage in a part of one of the semiconductor elements or the substrate.

17. The memory card according to claim 16, wherein said allowable current level is less than 200 mA.

18. A memory card comprising:

a plurality of semiconductor elements;

a substrate on which said plurality of semiconductor elements are stacked in a mounting area, said substrate also having a plurality of terminals for connecting to external equipment; and a fuse mounted on the outside of said mounting area of said plurality of semiconductor elements and mounted on a surface of said substrate near a power supply terminal among said plurality of terminals;

said power supply terminal and said plurality of semiconductor elements are connected via said fuse, wherein a first power supply connector which is electrically connected with said power supply terminal among said plurality of terminals, a fuse terminal which is electrically connected with both end parts of said fuse, and a second power supply connector which is electrically connected with a power supply input terminal of said plurality of semiconductor elements, are formed on the back surface of said substrate, and a power supply line is formed on the back surface of said substrate so that said first power supply connector and said second power supply connector are connected via said fuse.

19. The memory card according to claim 18, wherein a plurality of bonding pads which connect said plurality of semiconductor elements and said plurality of terminals on said substrate are formed around the outside of said mounting area, and said fuse is mounted near said power supply terminal among said plurality of terminals within an area in which said plurality of bonding pads are formed.

20. The memory card according to claim 18, wherein said plurality of semiconductor elements, said fuse and said substrate excluding said plurality of terminals are sealed by a resin mold and formed as a single body in the shape of a card.

21. The memory card according to claim 18, wherein said memory card includes a plurality of memory chips and a controller chip as said plurality of semiconductor elements which are stacked and said controller chip is stacked on a memory chip which is stacked on the highest layer of said plurality of memory chips.

22. The memory card according to claim 18, wherein said substrate includes a protrusion on which other elements are mounted is formed on a part of the periphery of said substrate, and said fuse is mounted on said protrusion.

23. The memory card according to claim 18, wherein said fuse cuts off a power supply to said plurality of semiconductor elements when an overcurrent which flows in said fuse exceeds an allowable current level.

* * * * *